(12) United States Patent
Yeh

(10) Patent No.: US 10,762,970 B2
(45) Date of Patent: Sep. 1, 2020

(54) INSPECTION METHOD FOR MEMORY INTEGRITY, NONVOLATILE MEMORY AND ELECTRONIC DEVICE

(71) Applicant: Winbond Electronics Corp., Taichung (TW)

(72) Inventor: Jun-Lin Yeh, Taichung (TW)

(73) Assignee: Winbond Electronics Corp., Taichung (TW)

( * ) Notice: Subject to any disclaimer, the term of this patent is extended or adjusted under 35 U.S.C. 154(b) by 133 days.

(21) Appl. No.: 15/981,918

(22) Filed: May 17, 2018

(65) Prior Publication Data
US 2019/0198122 A1    Jun. 27, 2019

(30) Foreign Application Priority Data

Dec. 27, 2017 (CN) .......................... 2017 1 1440910

(51) Int. Cl.
*G11C 16/34* (2006.01)
*G06F 11/10* (2006.01)
(Continued)

(52) U.S. Cl.
CPC ...... *G11C 16/3404* (2013.01); *G06F 11/1012* (2013.01); *G11C 16/04* (2013.01);
(Continued)

(58) Field of Classification Search
CPC ..... G11C 16/3404; G11C 16/04; G11C 29/52; G11C 29/028; G11C 2029/0409; G11C 29/021; G06F 11/1012
(Continued)

(56) References Cited

U.S. PATENT DOCUMENTS 7,551,503 B2    6/2009  Ho
8,077,516 B2   12/2011  Hung et al.
(Continued)

FOREIGN PATENT DOCUMENTS

TW    201001430    1/2010
TW    201110128    3/2011

OTHER PUBLICATIONS

Office Action of Taiwan Counterpart Application, dated Sep. 18, 2018, pp. 1-4.

*Primary Examiner* — James C Kerveros
(74) *Attorney, Agent, or Firm* — JCIPRNET

(57) ABSTRACT

An inspection method for memory integrity, a non-volatile memory, and an electronic device are provided. The method includes following steps. A threshold voltage of at least one memory cell to-be-inspected in a non-volatile memory is obtained. A data value belonging to the at least one memory cell to-be-inspected is determined by comparing a read voltage and the threshold voltage. When the data value belonging to the at least one memory cell to-be-inspected is determined, a preset voltage is set according to the data value. An offset data value belonging to the at least one memory cell to-be-inspected is obtained by comparing the preset voltage and the threshold voltage of the at least one memory cell to-be-inspected. And, whether the data value and the offset data value belonging to the at least one memory cell to-be-inspected are the same is determined, so as to determine whether an integrity of the memory cell to-be-inspected is defective.

20 Claims, 4 Drawing Sheets

(51) Int. Cl.
*G11C 16/04* (2006.01)
*G11C 29/52* (2006.01)
*G11C 29/02* (2006.01)
*G11C 29/04* (2006.01)

(52) U.S. Cl.
CPC ............ *G11C 29/52* (2013.01); *G11C 29/021* (2013.01); *G11C 29/028* (2013.01); *G11C 2029/0409* (2013.01)

(58) Field of Classification Search
USPC ........................................................ 714/721
See application file for complete search history.

(56) References Cited

U.S. PATENT DOCUMENTS

| | | | |
|---|---|---|---|
| 8,179,717 B2 | 5/2012 | Shepard et al. | |
| 9,147,483 B2* | 9/2015 | Yoon | G11C 11/5642 |
| 9,329,921 B2 | 5/2016 | Weilemann, II et al. | |
| 9,431,130 B2* | 8/2016 | Sakurada | H03M 13/1111 |
| 9,437,315 B2* | 9/2016 | Lee | G11C 7/14 |
| 2006/0155882 A1 | 7/2006 | Jochemsen et al. | |
| 2011/0107161 A1 | 5/2011 | Eguchi et al. | |

* cited by examiner

INSPECTION METHOD FOR MEMORY INTEGRITY, NONVOLATILE MEMORY AND ELECTRONIC DEVICE

CROSS-REFERENCE TO RELATED APPLICATION

This application claims the priority benefit of China application serial no. 201711440910.1, filed on Dec. 27, 2017. The entirety of the above-mentioned patent application is hereby incorporated by reference herein and made a part of this specification.

BACKGROUND

Field of the Invention

The invention relates to a memory inspecting technique and more particularly, to an inspection method for a memory integrity, a non-volatile memory and an electronic device using the non-volatile memory.

Description of Related Art

A non-volatile memory (for example, a flash memory) capable of storing data for a long time during a period that no power is supplied is one of essential components of an electronic device. Reliability of the non-volatile memory is related to a data retention lifespan thereof. In other words, due to various factors or latent reasons, the data retention time of the non-volatile memory may be reduced or damaged when accessing data, and as a result, the non-volatile memory may be deteriorated in accessing data. Theses latent reasons include, for example, a stress induced leakage current issue occurring after a cycling operation performed on data, disturb issues during the programming/erasing operation, mobile ions in the device and so on.

For a general consumer electronic device, data errors occurring in the memory may merely lead to errors in part of the data or functional defects and may be corrected by many methods. However, for automobile applications, such as autonomous vehicles or the autonomous driving field, the errors in part of the data or the functional defects may probably cause system failure, which is crucial to a user's life. Therefore, how to allow the electronic product to diagnose whether the data retention lifespan of the non-volatile memory is to expire is a major subject of technical research.

SUMMARY

The invention provides an inspection method for a memory integrity, a non-volatile memory and an electronic device using the non-volatile memory which can self determine whether a memory cell to-be-inspected in the non-volatile memory has integrity or has a risk of damage as deterioration begins to appear, thereby facilitating functional safety of the non-volatile memory and the electronic device to meet international standards.

Specifically, the inspection method for the memory integrity, the non-volatile memory and the electronic device using the non-volatile memory provided by the embodiments of the invention can compare the preset voltage set according to the data value and the threshold voltage of the memory cell to-be-inspected, thereby implementing the memory data integrity inspection to determine whether the memory cell to-be-inspected is in integrity or is in a condition of being exposed to a risk of imminent damage but still being usable presently (i.e., the integrity of the memory is defective). In other words, to prevent the non-volatile memory from being damaged, the non-volatile memory of the embodiments of the invention can self inspect whether the memory integrity thereof is in good condition in advance for each of the memory cells. In this way, the electronic device can be informed beforehand of whether the non-volatile memory will be damaged, which facilitates the functional safety of the electronic device.

In order to make the aforementioned and other features and advantages of the invention more comprehensible, several embodiments accompanied with figures are described in detail below.

BRIEF DESCRIPTION OF THE DRAWINGS

The accompanying drawings are provided for a understanding of the invention, and the drawings illustrate embodiments of the invention and, together with the description, serve to explain the principles of the invention.

DESCRIPTION OF EMBODIMENTS

Figure 1:
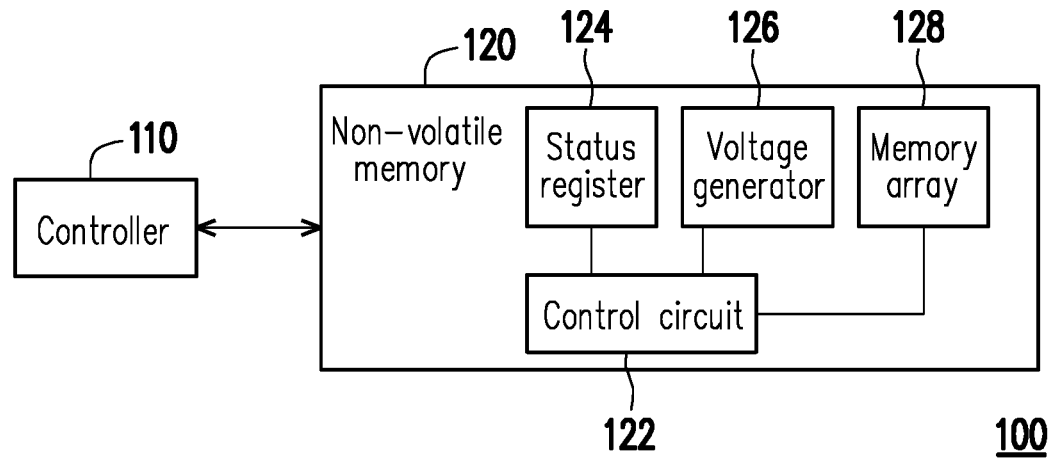
FIG. 1 is a functional block diagram illustrating an electronic device according to an embodiment of the invention.

FIG. 1 is a functional block diagram illustrating an electronic device 100 according to an embodiment of the invention. The electronic device 100 includes a controller 110 and a non-volatile memory 120. The controller 110 may be a central processing unit (CPU) or a memory controller. The non-volatile memory 120 mainly includes a control circuit 122 and a memory array 128. The non-volatile memory 120 may further include a status register 124 and a voltage generator 126. The non-volatile memory 120 may be a flash memory, and is implemented by a serial peripheral interface (SPI) NOR flash memory in the present embodiment. The present embodiment is demonstrated by considering the electronic device 100 as the subject or considering the non-volatile memory 120 as the subject. The memory array 128 includes a plurality of memory cells.

In order to make the electronic device 100 and the non-volatile memory 120 to be capable of performing hazard analysis & risk assessment on the functionality of the non-volatile memory 120, the non-volatile memory 120 of the embodiments of the invention may determine whether a memory cell to-be-inspected in the memory array 128 has integrity or is exposed to a risk of damage as deterioration beginning to appear (such situation is referred to as the memory integrity being defective in this case) by performing memory data integrity inspection. In other words, in order to prevent the non-volatile memory 120 from being damaged, in the embodiments of the invention, each memory cell may self-inspect whether its memory integrity is defective, such that the electronic device 100 may be informed of whether the non-volatile memory 120 is exposed to the risk of damage beforehand, which facilitates the functional safety of the electronic device 100 to be in compliance with international standards.

Figure 2:
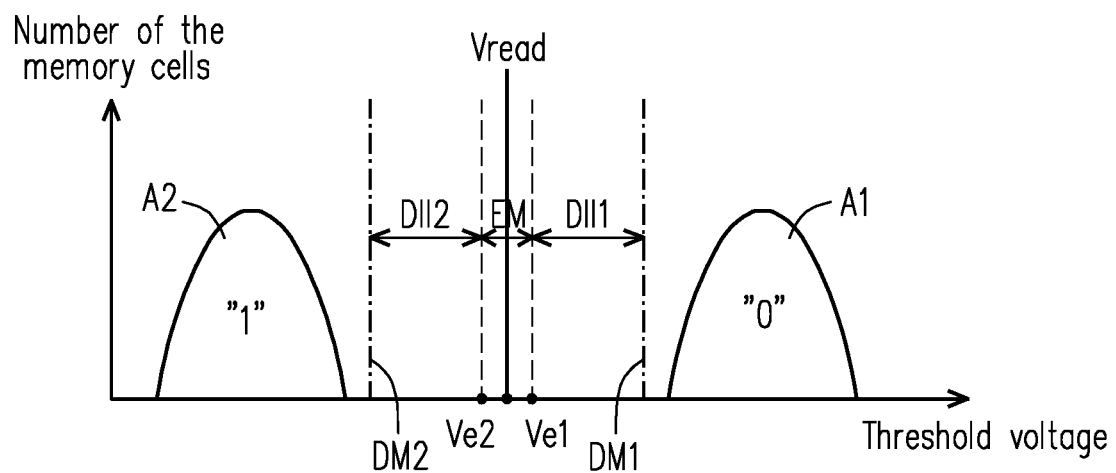
FIG. 2 is a schematic diagram illustrating preset voltages, data integrity intervals of memory cells, fail voltages and an identification interval according to an embodiment of the invention.

FIG. 2 is a schematic diagram illustrating preset voltages DM1 and DM2, data integrity intervals DII1 and DII2 of memory cells, fail voltages Ve1 and Ve2 and an identification interval EM. In FIG. 2, the non-volatile memory 120 illustrated in FIG. 1 is implemented by a flash memory as an example in the present embodiment. A relation between the number of the memory cells in the flash memory (i.e., the vertical axis) and threshold voltages of the memory cells (i.e., the horizontal axis) is as illustrated in FIG. 2. When a threshold voltage of a memory cell is greater than a preset read voltage Vread, it may be considered that a data value of the memory cell is logic "0". When a threshold voltage of a memory cell is less than the preset read voltage Vread, it may be considered that a data value of the memory cell is logic "1". Generally, in the flash memory in normal use (i.e., the memory integrity is not defective), a threshold voltage of a memory cell, after a programming/erasing operation, usually falls within an area A1 or an area A2.

However, in an actual operation of the flash memory, as the number of cycling operation of data is increased, the threshold voltage of the memory cell may gradually encounter a deterioration phenomenon and moves toward an identification interval EM where a data value of the memory cell is incapable of being determined. To be specific, when the threshold voltage of the memory cell encounters the deterioration phenomenon and falls within the identification interval EM, the control circuit belonging to the flash memory is incapable of identifying whether data stored in the memory cell is logic "0" or logic "1", which causes the control circuit to fail to read the memory cell. The identification interval EM is located between the fail voltage Ve1 corresponding to the logic "0" and the fail voltage Ve2 corresponding to the logic "1". In this circumstance, the flash memory may probably encounter a data reading error, which may directly leads to loss of function in the electronic device. In other words, when the threshold voltage of the memory cell falls within the identification interval EM, the flash memory may be probably directly damaged and fail to perform other operations.

Therefore, in the embodiments of the invention, it is expected that the non-volatile memory 120 may self-inspect each memory cell in advance to determine whether its memory integrity is defective, thereby preventing a situation that the reading error is not found until the threshold voltage of the memory cell falls within the identification interval EM. As illustrated in FIG. 2, the interval DII1 is provided between the area A1 and the identification interval EM, and the interval DII2 is provided between the area A2 and the identification interval EM. If the threshold voltage of the memory cell is detected as being located between the two intervals DII1 and DII2, it may be found that even though the memory cell may be normally used (i.e., the non-volatile memory may normally determine the data value of the memory cell), the memory cell begins to tend to be deteriorated, which indicates that an access speed and a response time of the memory cell in fact becomes slower than relatively normal memory cells, and a risk of damage may appear (in this case, the memory integrity is considered as being defective).

Accordingly, the main conception of the embodiments of the invention lies in performing memory integrity inspection on each memory cell in the non-volatile memory 120 to examine whether the threshold voltage of each memory cell still falls within the areas A1 and A2 or falls within the data integrity intervals DII1 and DII2. If there is any memory cell falling within the data integrity interval DII1 or DII2, it indicates that a portion of the memory cells in the non-volatile memory may probably be deteriorated, such that the data integrity of the non-volatile memory is considered as being defective.

The interval DII1 is located between the preset voltage DM1 corresponding to logic "0" and the fail voltage Ve1 corresponding to logic "0". The interval DII2 is located between the preset voltage DM2 corresponding to logic "1" and the fail voltage Ve2 corresponding to logic "1". An absolute value of the preset voltage DM1 or DM2 deducted by the read voltage Vread is greater than an absolute value of the fail voltage Ve1 or Ve2 deducted by the read voltage Vread. The data integrity intervals DII1 and DII2 and the identification interval EM do not overlap with each other.

Figure 3:
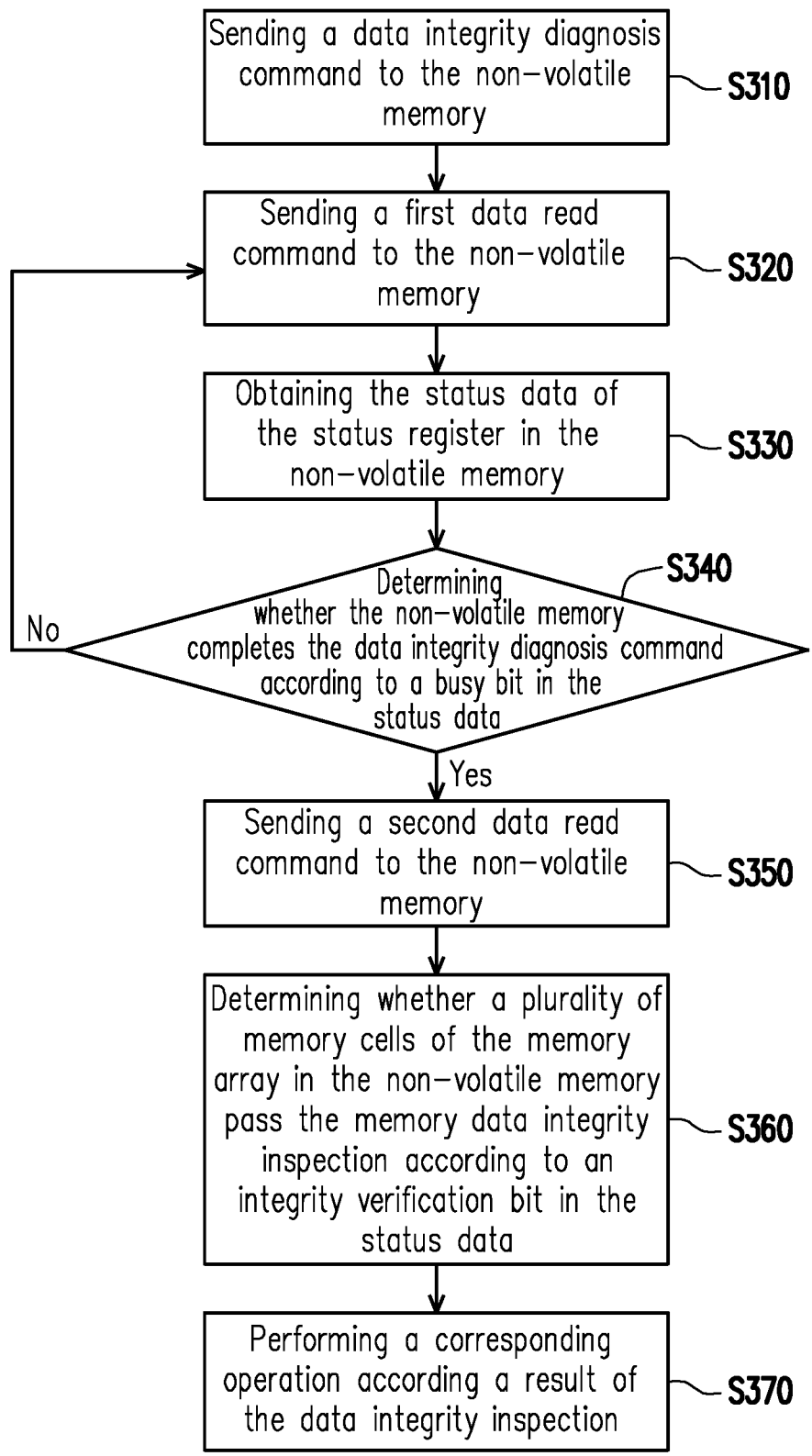
FIG. 3 is a flowchart illustrating an inspection method for a memory integrity performed on the non-volatile memory by the controller according to an embodiment of the invention.

FIG. 3 is a flowchart illustrating an inspection method for a memory integrity performed on the non-volatile memory 120 by the controller 110 according to an embodiment of the invention. In the embodiment illustrated in FIG. 3, the controller 110 mainly serves as a command sender to instruct the non-volatile memory 120 to perform an operation process of data integrity inspection. Referring to FIG. 1 and FIG. 3 simultaneously, in step S310, the controller 110 sends a data integrity diagnosis command to the control circuit 122 of the non-volatile memory 120. In step S320, the controller 110 sends a first data read command to the non-volatile memory 120. In step S330, the controller 110 obtains the status data of the status register 124 in the non-volatile memory 120 from the non-volatile memory 120. To be specific, each status data has a plurality of bits, and each bit may be indicate each state of the non-volatile memory. For example, the status data of the present embodiment has bits S0 to S15. The bit S0 represents a busy bit, and the bit S10 represents an integrity verification bit. A first data read command in the present embodiment may be instructed to read the bits S0 to S7 in the status data, and a second data read command in the present embodiment may be instructed to read the bits S8 to S15 in the status data. When the first data read command is received by the control circuit 122, the control circuit 122 of the non-volatile memory 120 transmits the status data (for example, the bits S0 to S7) including the busy bit to the controller 110 through the status register 124.

In step S340, the controller 110 determines whether the non-volatile memory 120 completes the aforementioned data integrity diagnosis command according to the busy bit in the status data. In the present embodiment, if the non-volatile memory 120 is performing a related operation, the busy bit is presented by logic "1", and if the non-volatile memory 120 does not perform any related operation, the busy bit is presented by logic "0". When the controller 110 determines that the busy bit is logic "1", it indicates that the non-volatile memory 120 does not complete the data integrity diagnosis command, and returning to steps S320 and S330, the status data of the non-volatile memory 120 continues to be obtained to determine whether the non-volatile memory 120 is still in the busy state. When the controller 110 determines that the busy bit is logic "0", it indicates that the non-volatile memory 120 has completed the data integrity diagnosis command. Thus, entering step S350 from step S340, the controller 110 sends the second data read command to the non-volatile memory 120. When receiving the second data read command by the control circuit 122, the control circuit 122 of the non-volatile memory 120 transmits the status data (for example, the bits S8 to S15) including the integrity verification bit from the status register 124 to the controller 110.

In step S360, the controller 110 determines whether a plurality of memory cells of the memory array in the non-volatile memory 120 pass the memory data integrity inspection according to the integrity verification bit in the status data. In the present embodiment, when the integrity verification bit is logic "1", it indicates that the integrity of each memory cell in the non-volatile memory 120 is not defective, such that the non-volatile memory 120 is verified by the memory data integrity inspection. On the other hand, when the integrity verification bit is logic "0", it indicates that the integrity a portion of the memory cells in the non-volatile memory 120 is defective, such that the non-volatile memory 120 is not verified by the memory data integrity inspection. In step S370, the controller 110 performs a corresponding operation according a result of the data integrity inspection. For example, when the integrity of the non-volatile memory 120 is defective, the controller 110 may control the non-volatile memory 120 to directly ignore the defective portion of memory cells from being used, and only the memory cell in normal operation may be used. Alternatively, after being informed that the non-volatile memory is not verified by the memory data integrity inspection, the controller 110 may notify a user/maintenance personnel of the electronic device 100 by a warning device, thereby determining whether to replace the non-volatile memory 120.

Figure 4:
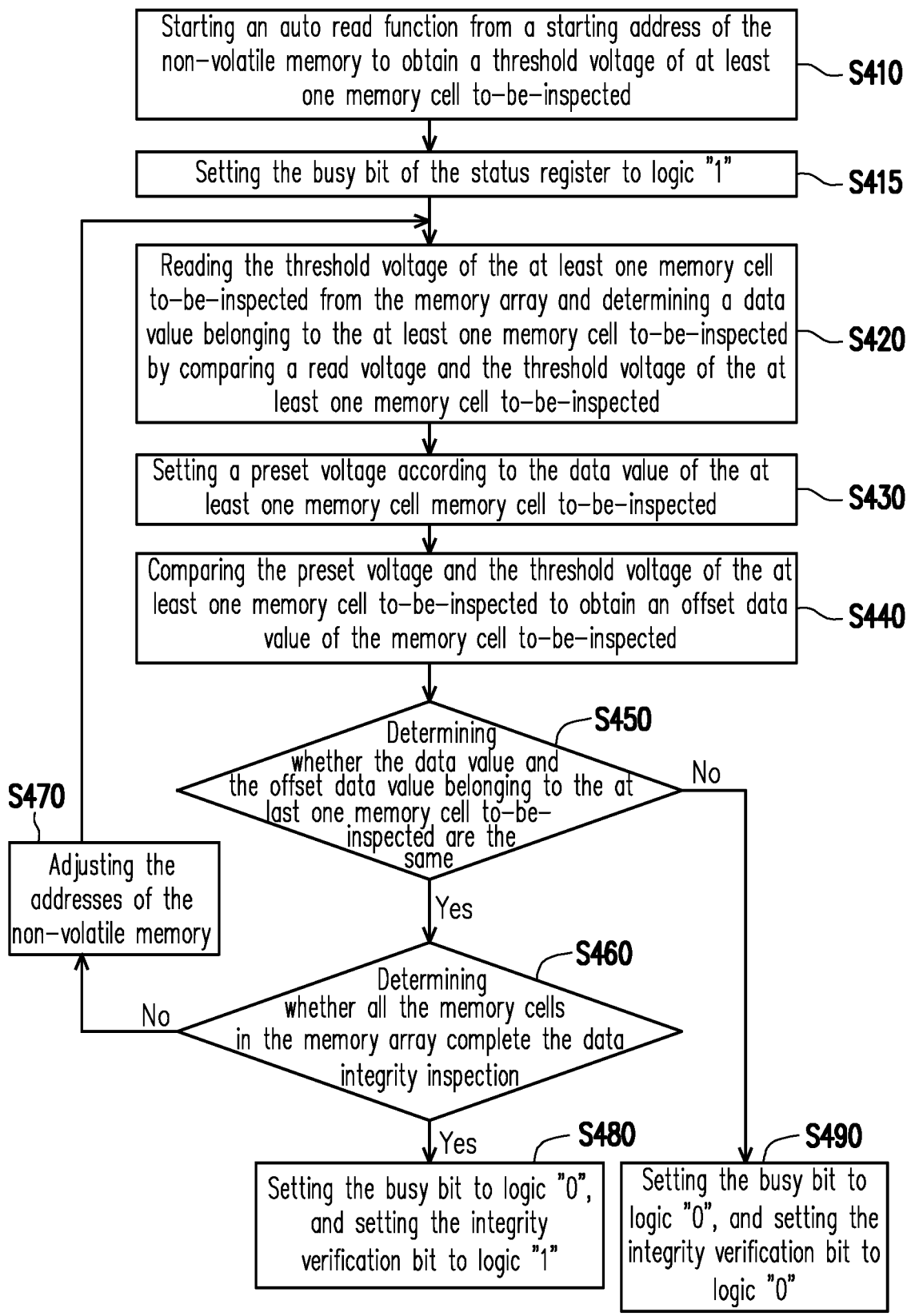
FIG. 4 is a flowchart illustrating in detail an inspection method for a memory integrity according to an embodiment of the invention.

FIG. 4 is a flowchart illustrating in detail an inspection method for a memory integrity according to an embodiment of the invention. Referring to FIG. 1 and FIG. 4 simultaneously, in step S410, when the data integrity diagnosis command is received, the control circuit 122 in the non-volatile memory 120 starts an auto read function from a starting address of the non-volatile memory 120 to obtain a threshold voltage of at least one memory cell to-be-inspected. In the present embodiment illustrated in FIG. 4, each memory cell in the memory array 128 is sequentially treated as a "memory cell to-be-inspected" during a data integrity diagnosis operation. In step S415, the control circuit 122 sets the busy bit of the status register 124 to logic "1", thereby informing the controller 110 that the data integrity diagnosis operation is being performed.

In step S420, the control circuit 122 reads the threshold voltage of the memory cell to-be-inspected from the memory array 128 and determines a data value belonging to the memory cell to-be-inspected by comparing a read voltage (for example, the voltage Vread illustrated in FIG. 2) and the threshold voltage of the memory cell to-be-inspected (i.e., the control circuit 122 performs a normal reading operation on the memory cell to-be-inspected with the read voltage). The aforementioned data value is, for example, logic "0" or logic "1". In step S420, the control circuit 122 may further latch the data value according to a hardware design. The read voltage Vread may be generated by the voltage generator 126. In step S430, the control circuit 122 sets a preset voltage according to the data value of the memory cell to-be-inspected. If the data value of the memory cell to-be-inspected is logic "0", the preset voltage is set as the voltage DM1 illustrated in FIG. 2, and if the data value of the memory cell to-be-inspected is logic "1", the preset voltage is set as the voltage DM2 illustrated in FIG. 2.

In step S440, the control circuit 122 compares the preset voltage which is set in step S430 and the threshold voltage of the at least one memory cell to-be-inspected (i.e., the memory cell to-be-inspected is offset and read by the control circuit 122 with the set preset voltage) to obtain an offset data value of the memory cell to-be-inspected. To be specific, if the set preset voltage is DM1, the offset data value of the memory cell to-be-inspected may be considered as logic "0" when the threshold voltage of the memory cell to-be-inspected is greater than the preset voltage DM1, and the offset data value of the memory cell to-be-inspected may be considered as logic "1" when the threshold voltage of the memory cell to-be-inspected is less than the preset voltage DM1. On the other hand, if the set preset voltage is DM2, the offset data value of the memory cell to-be-inspected may be considered as logic "1" when the threshold voltage of the memory cell to-be-inspected is less than the preset voltage DM2, and the data value of the memory cell to-be-inspected may be considered as logic "0" when the threshold voltage of the memory cell to-be-inspected is greater than the preset voltage DM2.

In step S450, the control circuit 122 determines whether the data value belonging to the memory cell to-be-inspected is the same as the offset data value obtained in step S440. When the data value and the offset data value belonging to the memory cell to-be-inspected are the same, it indicates that the threshold voltage of the memory cell to-be-inspected is simultaneously greater than the fail voltage Ve1 and greater than the preset voltage DM1 illustrated in FIG. 2 and thus the threshold voltage of the memory cell to-be-inspected is located within the area A1, or alternatively, the threshold voltage of the memory cell to-be-inspected is simultaneously less than the fail voltage Ve2 and less than the fail voltage DM2 illustrated in FIG. 2 and thus the threshold voltage of the memory cell to-be-inspected is located within the area A2. Namely, the memory cell to-be-inspected is in normal operation, and the threshold voltage of the memory cell to-be-inspected is not located within the data integrity interval DII1 or DII2 illustrated in FIG. 2. Thus, entering step S460 from step S450, the control circuit 122 determines whether all the memory cells in the memory array 128 complete the data integrity inspection. If not all the memory cells in the memory array 128 complete the data integrity inspection, entering step S470 from step S460, the control circuit 122 adjusts the addresses of the non-volatile memory 120 (for example, by adding the addresses by 1) and returning to step S420, performs steps S420 to S460 repeatedly. If all the memory cells in the memory array 128 complete the data integrity inspection, entering step S480 from step S460, the control circuit 122 sets the busy bit to logic "0" to indicate that the non-volatile memory 120 is not busy and sets the integrity verification bit to logic "1". The integrity verification bit corresponding to logic "1" is employed to indicate that the non-volatile memory 120 completes the data integrity inspection without any defect of the data integrity found in memory cells.

In the assumption that the data value belonging to the memory cell to-be-inspected is logic "0", if the control circuit 122 determines that the data value (which is logic "0") and the offset data value (which is logic "1") belonging to the memory cell to-be-inspected are different, it indicates that the threshold voltage of the memory cell to-be-inspected is greater than the fail voltage Ve1 illustrated in FIG. 2, but not greater than the preset voltage DM1, such that the threshold voltage of the memory cell to-be-inspected is located within the data integrity interval DII1. On the other hand, in the assumption that the data value belonging to the memory cell to-be-inspected is logic "1", if the control circuit 122 determines that the data value (which is logic "1") and the offset data value (which is logic "0") belonging to the memory cell to-be-inspected are different, it indicates that the threshold voltage of the memory cell to-be-inspected is less than the fail voltage Ve2 illustrated in FIG. 2, but not less than the preset voltage DM2, such that the threshold voltage of the memory cell to-be-inspected is located within the data integrity interval DII2. In this way, the data integrity of the non-volatile memory 120 is defective, and thus, entering step S490 from step S450, the control circuit 122 sets the busy bit to logic "0" to indicate that the non-volatile memory 120 is not busy and sets the integrity verification bit to logic "0". The integrity verification bit corresponding to logic "0" is employed to indicate that the non-volatile memory 120 completes the data integrity inspection with the defect of the data integrity found in a portion of the memory cells.

In the flowchart illustrated in FIG. 4, steps S420 to S460 of the data integrity inspection are performed by using a single memory cell to-be-inspected (i.e., 1 bit) as a unit, and one applying the present embodiment may also perform steps S420 to S460 of the data integrity inspection by using 8 memory cells to-be-inspected (i.e., 1 byte) as a unit, as long as the 8 memory cells to-be-inspected have the same data value (e.g., logic "0" or logic "1"). In part of the embodiments, the memory array may be divided into a plurality of blocks, and one applying the present embodiment may also perform steps S420 to S460 of the data integrity inspection by using the memory cells to-be-inspected in an entire block as a unit, as long as all the memory cells to-be-inspected in this block have the same data value.

Figure 5:
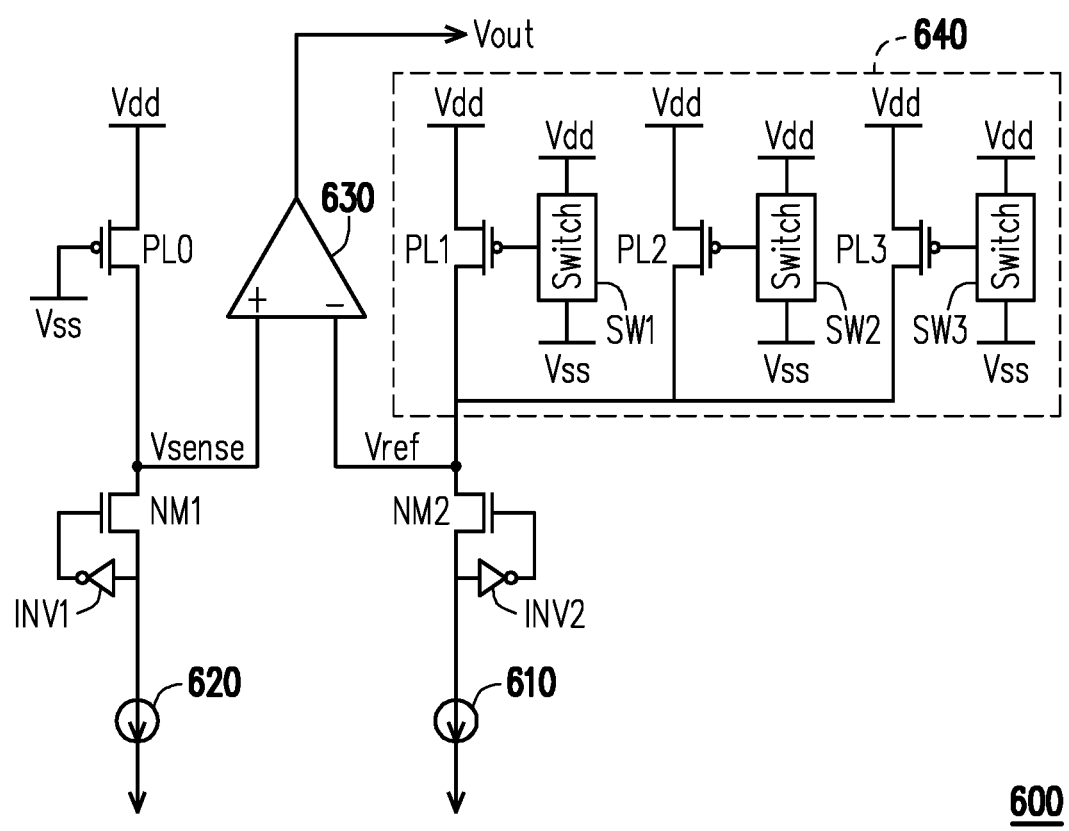
FIG. 5 is a circuit diagram illustrating a portion of the circuit (including the voltage generator) in the non-volatile memory according to an embodiment of the invention.

FIG. 5 is a circuit diagram illustrating a portion of the circuit (including the voltage generator 128) in the non-volatile memory 120 according to an embodiment of the invention. In the present embodiment, how to set/adjust reference voltages (for example, the read voltage Vread, the preset voltage DM1 corresponding to logic "0" and the preset voltage DM2 corresponding to logic "1" illustrated in FIG. 2) to be compared with the threshold voltages of the memory cells will be described with reference to FIG. 5. One applying the present embodiment may also achieve the switching of the aforementioned reference voltages by other circuits. The circuit illustrated in FIG. 5 includes a differential voltage sensor 600. The differential voltage sensor 600 mainly includes a reference current source 610, a memory cell current source 620, N-type transistors NM1 and NM2, inverters INV1 and INV2, a P-type transistor PL0, a differential amplifier 630 and a voltage generator 640. The voltage generator 640 is composed of a plurality of P-type transistors PL1 to PL3 and a plurality of switches SW1 to SW3. The reference current source 610 generates a fixed reference current. The memory cell current source 620 is coupled to a memory cell to-be-inspected to obtain a threshold voltage of the memory cell to-be-inspected. A non-inverting input terminal of the differential amplifier 630 receives a sensing voltage Vsense with respect to the threshold voltage of the memory cell to-be-inspected. An inverting terminal of the differential amplifier 630 receives a reference voltage Vref. A control terminal of the P-type transistor PL0 is connected to the ground (for example, to receive a ground voltage Vss). The voltage generator 640 may be configured to generate the read voltage Vread and the preset voltages DM1 and DM2 corresponding to data values (for example, logic "0" and logic "1").

In the present embodiment, when the reference voltage Vref is to be set as the read voltage Vread of the embodiment illustrated in FIG. 2, the switches SW1 and SW2 are controlled to connect control terminals of the P-type transistors PL1 and PL2 to the ground, and the switch SW3 is controlled for a control terminal of the P-type transistor PL3 to receive a power supply voltage Vdd, such that a sensing rate of the P-type transistor PL0 to the voltage generator 640 is adjusted as 2:1. In this way, the reference voltage Vref is made equal to the read voltage Vread, thereby performing a normal reading operation on the threshold voltage of the memory cell to-be-inspected to determine the data value belonging thereto.

When the data value belonging to the memory cell to-be-inspected is logic "0", the differential voltage sensor 600 has to set the reference voltage Vref as the preset voltage DM1 illustrated in FIG. 2. In the present embodiment, the switches SW1 to SW3 may be controlled to connect all the control terminals of the P-type transistors PL1 to PL3 to the ground, such that sensing rate of the P-type transistor PL0 to the voltage generator 640 is reduced to 3:1. In this way, the reference voltage Vref is made equal to the preset voltage DM1, thereby offsetting and reading the threshold voltage of the memory cell to-be-inspected corresponding to logic "0" to determine the offset data value belonging thereto. When the data value belonging to the memory cell to-be-inspected is logic "1", the circuit 600 has to set the reference voltage Vref as the preset voltage DM2 illustrated in FIG. 2. In the present embodiment, the switch SW1 may be controlled to connect the control terminal of the P-type transistor PL1 to the ground, and the switches SW2 to SW3 may be controlled for the control terminals of the P-type transistors PL2 to PL3 to receive the power supply voltage Vdd, such that the sensing rate of the P-type transistor PL0 to the voltage generator 640 is adjusted as 1:1. In this way, the reference voltage Vref is made equal to the preset voltage DM1, thereby offsetting and reading the threshold voltage of the memory cell to-be-inspected corresponding to logic "1" to determine the offset data value belonging thereto.

In light of the foregoing, the inspection method for the memory integrity, the non-volatile memory and the electronic device using the non-volatile memory provided by the embodiments of the invention can, for each of the memory cells to-be-inspected in the non-volatile memory, compare the data value obtained by the normal reading operation and the offset data value obtained by offsetting and reading, thereby implementing the memory data integrity inspection to determine whether the memory cell to-be-inspected is in integrity or is exposed to the risk of deterioration (i.e., the integrity of the memory is defective). In other words, to prevent the non-volatile memory from being damaged, the non-volatile memory of the embodiments of the invention can self inspect whether the memory integrity thereof is in good condition in advance for each of the memory cells. In this way, the electronic device can be informed beforehand of whether the non-volatile memory is probably to be damaged, which facilitates the functional safety of the electronic device to be in compliance with international standards.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An inspection method for a memory integrity, comprising:

obtaining a threshold voltage of at least one memory cell to-be-inspected in a non-volatile memory;

determining a data value belonging to the at least one memory cell to-be-inspected by comparing a read voltage and the threshold voltage, wherein the data value has a first logic state when the threshold voltage is greater than the read voltage, and the data value has a second logic state when the threshold voltage is not greater than the read voltage;

setting preset voltage according to the data value when the data value belonging to the at least one memory cell to-be-inspected is determined;

obtaining an offset data value belonging to the at least one memory cell by comparing the preset voltage and the threshold voltage of the at least one memory cell to-be-inspected, wherein the offset data value has the first logic state when the threshold voltage of the at least one memory cell to-be-inspected is greater than the preset voltage, and the offset data value has the second logic state when the threshold voltage of the at least one memory cell to-be-inspected is not greater than the preset voltage;

determining whether the data value belonging to the at least one memory cell to-be-inspected and the offset data value belonging to the at least one memory cell to-be-inspected are the same; and determining that the integrity of the memory cell to-be-inspected is not defective in response to determining that the data value belonging to the at least one memory cell to-be-inspected and the offset data value belonging to the at least one memory cell to-be-inspected are the same.

2. The inspection method according to claim 1, further comprising:

determining that the integrity of the memory cell to-be-inspected is defective in response to determining that the data value belonging to the at least one memory cell to-be-inspected and the offset data value belonging to the at least one memory cell to-be-inspected are different.

3. The inspection method according to claim 1, further comprising:

sensing a data integrity diagnosis command to the non-volatile memory;

sending a first data read command to the non-volatile memory to obtain status data of a status register in the non-volatile memory and determining whether the non-volatile memory completes the data integrity diagnosis command according to a busy bit in the status data, wherein the busy bit is configured to indicate whether a memory data integrity inspection is being performed on the non-volatile memory;

sending a second data read command to the non-volatile memory when the data integrity diagnosis command is completed to obtain an integrity verification bit in the status data of the status register; and determining an integrity of a plurality of memory cells in the non-volatile memory is defective according to the integrity verification bit to determine, wherein the memory cells comprise the at least one memory cell to-be-inspected.

4. The inspection method according to claim 3, wherein the first data read command is instructed to read parts of bits in the status data.

5. The inspection method according to claim 3, wherein the second data read command is instructed to read another parts of bits in the status data, wherein the parts of bits in the status data are different form the another parts of bits in the status data.

6. The inspection method according to claim 3, wherein the status data has 16 bits, first data read command is instructed to read a zero bit to a seventh bit in the status data, and the second data read command is instructed to an eighth bit to a fifteenth bit in the status data.

7. The inspection method according to claim 3, wherein the busy bit is presented by logic "1" if the non-volatile memory is performing operations, and the busy bit is presented by logic "0" if the non-volatile memory does not perform any operation.

8. A non-volatile memory, comprising:

a memory array, comprising a plurality of memory cells; and a control circuit, coupled to the memory array, wherein the control circuit performs memory data integrity inspection to obtain a threshold voltage of at least one memory cell to-be-inspected among the memory cells, determines a data value belonging to the at least one memory cell to-be-inspected by comparing a read voltage and the threshold voltage, wherein the data value has a first logic state when the threshold voltage is greater than the read voltage, and the data value has a second logic state when the threshold voltage is not greater than the read voltage, sets preset voltage according to the data value when the data value belonging to the at least one memory cell to-be-inspected is determined, obtains an offset data value belonging to the at least one memory cell to-be-inspected by comparing the preset voltage and the threshold voltage of the at least one memory cell to-be-inspected, wherein the offset data value has the first logic state when the threshold voltage of the at least one memory cell to-be-inspected is greater than the preset voltage, and the offset data value has the second logic state when the threshold voltage of the at least one memory cell to-be-inspected is not greater than the preset voltage, determines whether the data value belonging to the at least one memory cell to-be-inspected and the offset data value belonging to the at least one memory cell to-be-inspected are the same, and determines that the integrity of the memory cell to-be-inspected is not defective in response to determining that the data value belonging to the at least one memory cell to-be-inspected and the offset data value belonging to the at least one memory cell to-be-inspected are the same.

9. The non-volatile memory according to claim 8, further comprising:

a status register, storing status data, wherein the status data comprises a busy bit and an integrity verification bit, wherein the busy bit is configured to indicate whether the memory data integrity inspection is being performed on the non-volatile memory, and the integrity verification bit is configured to indicate whether integrities of the memory cells in the memory array are defective.

10. The non-volatile memory according to claim 9, wherein the control circuit transmits the status data including the busy bit to a controller through the status register when the first data read command send from the controller is received by the control circuit.

11. The non-volatile memory according to claim 10, wherein the control circuit transmits the status data including the integrity verification bit from the status register to the controller when the second data read command send from the controller is received by the control circuit.

12. The non-volatile memory according to claim 11, wherein the status data has 16 bits, first data read command is instructed to read a zero bit to a seventh bit in the status data, and the second data read command is instructed to an eighth bit to a fifteenth bit in the status data.

13. The non-volatile memory according to claim 9, wherein the busy bit is presented by logic "1" if the non-volatile memory is performing operations, and the busy bit is presented by logic "0" if the non-volatile memory does not perform any operation.

14. The non-volatile memory according to claim 8, wherein
when the data value and the offset data value are different, the control circuit determines that the integrity of the memory cell to-be-inspected is defective.

15. The non-volatile memory according to claim 8, further comprising:
a voltage generator, configured to generate the read voltage and the preset voltage corresponding to the data value.

16. An electronic device, comprising:
a non-volatile memory, comprising a memory array and a status register; and
a controller, coupled to the non-volatile memory,
wherein the controller sends a data integrity diagnosis command to the non-volatile memory,
sends a first data read command to the non-volatile memory to obtain status data of the status register and to determine whether the non-volatile memory completes the data integrity diagnosis command according to a busy bit in the status data,
when the data integrity diagnosis command is completed, the controller sends a second data read command to the non-volatile memory to obtain an integrity verification bit in the status data of the status register and to determine whether an integrity of a plurality of memory cells in the memory array is defective according to the integrity verification bit, wherein the busy bit is configured to indicate whether a memory data integrity inspection is being performed on the non-volatile memory,
wherein the non-volatile memory, when receiving the data integrity diagnosis command, obtains a threshold voltage of at least one memory cell to-be-inspected in the non-volatile memory,
determines a data value belonging to the at least one memory cell to-be-inspected by comparing a read voltage and the threshold voltage, wherein the data value has a first logic state when the threshold voltage is greater than the read voltage, and the data value has a second logic state when the threshold voltage is not greater than the read voltage,
the non-volatile memory sets a preset voltage according to the data value when the data value belonging to the at least one memory cell to-be-inspected is determined,
obtains an offset data value belonging to the at least one memory cell to-be-inspected by comparing the preset voltage and the threshold voltage of the at least one memory cell to-be-inspected, wherein the offset data value has the first logic state when the threshold voltage of the at least one memory cell to-be-inspected is greater than the preset voltage, and the offset data value has the second logic state when the threshold voltage of the at least one memory cell to-be-inspected is not greater than the preset voltage,
determines whether the data value belonging to the at least one memory cell to-be-inspected and the offset data value belonging to the at least one memory cell to-be-inspected are the same, and
determines that the integrity of the memory cell to-be-inspected is not defective in response to determining that the data value belonging to the at least one memory cell to-be-inspected and the offset data value belonging to the at least one memory cell to-be-inspected are the same.

17. The electronic device according to claim 16, wherein when the data value and the offset data value are different, the non-volatile memory determines that the integrity of the memory cell to-be-inspected is defective.

18. The electronic device according to claim 16, the non-volatile memory further comprises:
a voltage generator, configured to generate the read voltage and the preset voltage corresponding to the data value.

19. The electronic device according to claim 16, wherein the first data read command is instructed to read parts of bits in the status data.

20. The electronic device according to claim 16, wherein the second data read command is instructed to read another parts of bits in the status data, wherein the parts of bits in the status data are different form the another parts of bits in the status data.

* * * * *